(12) United States Patent
Shin

(10) Patent No.: US 8,999,613 B2
(45) Date of Patent: Apr. 7, 2015

(54) MASK

(71) Applicant: LG Chem Ltd., Seoul (KR)

(72) Inventor: Bu Gon Shin, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/959,427

(22) Filed: Aug. 5, 2013

(65) Prior Publication Data

US 2013/0314685 A1 Nov. 28, 2013

Related U.S. Application Data

(63) Continuation of application No. PCT/KR2012/010392, filed on Dec. 3, 2012.

(30) Foreign Application Priority Data

Dec. 1, 2011 (KR) .......................... 10-2011-0127628
Dec. 3, 2012 (KR) .......................... 10-2012-0138867

(51) Int. Cl.
  *G03F 1/00* (2012.01)
  *G03F 7/20* (2006.01)
  *G03F 1/54* (2012.01)
  *G03F 1/50* (2012.01)

(52) U.S. Cl.
  CPC ........ *G03F 7/70733* (2013.01); *G03F 7/70691* (2013.01); *G03F 1/00* (2013.01); *G03F 1/54* (2013.01); *G03F 1/50* (2013.01)

(58) Field of Classification Search
  CPC .......... G03F 1/00; G03F 1/16; G03F 7/70691
  USPC ................................................. 430/5
  See application file for complete search history.

(56) References Cited

U.S. PATENT DOCUMENTS

| | | | |
|---|---|---|---|
| 5,344,729 A * | 9/1994 | Akins et al. ....................... | 430/5 |
| 2006/0147817 A1* | 7/2006 | Hosono ............................. | 430/5 |
| 2007/0020531 A1* | 1/2007 | Lin .................................... | 430/5 |
| 2008/0206682 A1* | 8/2008 | Won et al. ....................... | 430/321 |
| 2010/0062350 A1* | 3/2010 | Abe et al. ........................ | 430/5 |
| 2010/0173231 A1* | 7/2010 | Naka et al. ....................... | 430/5 |
| 2010/0261098 A1* | 10/2010 | Hogue et al. .................... | 430/5 |
| 2013/0321787 A1* | 12/2013 | Shin .................................. | 355/72 |

FOREIGN PATENT DOCUMENTS

| | | | |
|---|---|---|---|
| JP | 2008083215 A | 4/2008 | |
| JP | 2010060681 A | 3/2010 | |
| KR | 100192360 B1 | 6/1999 | |
| KR | 100248209 B1 | 3/2000 | |
| KR | 1020060053117 A | 5/2006 | |
| KR | 1020070112509 A | 11/2007 | |
| KR | 1020090112546 A | 10/2009 | |
| TW | 200728931 | 8/2007 | |
| TW | 401196 U1 | 4/2011 | |

* cited by examiner

*Primary Examiner* — Stewart Fraser
(74) *Attorney, Agent, or Firm* — McKenna Long & Aldridge LLP

(57) ABSTRACT

Provided are a mask, a method of manufacturing the same, a light irradiation device, a method of radiating light, and a method of manufacturing an orientationally ordered photo-alignment layer. By the mask, collimated light or nearly collimated light may be irradiated with uniform illumination to a surface of an object to be irradiated. Further, by the mask, light may be effectively incident even on the object to be irradiated in the curved shape.

20 Claims, 10 Drawing Sheets

MASK

This application is a Continuation Bypass Application of International Patent Application No. PCT/KR2012/010392, filed Dec. 3, 2012, and claims the benefit of Korean Patent Application Nos. 10-2011-0127628filed on Dec. 1, 2011, and 10-2012-0138867filed on Dec. 3, 2012, in the Korean Intellectual Property Office, the disclosures of which are incorporated herein by reference.

FIELD

The present application relates to a mask, a method of manufacturing a mask, a light irradiation device, a method of irradiating light, and a method of manufacturing an orientationally ordered photo-alignment layer.

BACKGROUND

An alignment layer for liquid crystals used to align liquid crystal molecules in a certain direction may be applied in various fields. As the alignment layer, there is a photo-alignment layer, a surface of which is treated by light irradiation so as to align adjacent liquid crystal molecules. Conventionally, the photo-alignment layer may be manufactured by orientationally ordering photosensitive materials by irradiating a layer of the photosensitive material with light such as linearly-polarized light.

For example, Patent Documents 1 and 2 disclose devices for forming the photo-alignment layers.

To more effectively form the photo-alignment layer, it is necessary to irradiate an object to be irradiated with collimated light or nearly collimated light with uniform illumination. A technique of forming collimated light or nearly collimated light with uniform illumination may be widely applied in various fields including a process of forming the photo-alignment layer, and exposure for photolithography.

RELATED ART DOCUMENTS

Patent Documents

[Patent Document 1] Korean Patent Publ. No. 2006-0053117

[Patent Document 2] Korean Patent Publ. No No. 2009-0112546

DISCLOSURE

Technical Problem

The present application provides a mask, a method of manufacturing a mask, a light irradiation device, a method of irradiating light, and a method of manufacturing an orientationally ordered photo-alignment layer.

Technical Solution

An illustrative mask may include a transparent supporting structure and a metal layer on one surface of the transparent supporting structure. In the metal layer, at least one opening capable of guiding light to an object to be irradiated may be formed. FIG. 1 shows a schematic of one illustrative embodiment of the mask including a transparent supporting structure 101 and a metal layer 102, through which an opening 1021 is formed.

The transparent supporting structure may be a structure, for example, prepared by using a material, through which light guided by the opening may pass. The structure may be rigid, and therefore may maintain the shape of a metal layer formed thereon. A transparent material, by which the structure may be formed, may be, but is not particularly limited to, a transparent ceramic such as zirconia, alumina, titania or quartz.

The metal layer may be formed on at least one surface of the transparent supporting structure, and at least one opening capable of guiding light toward a surface of the object to be irradiated. The term "opening capable of guiding light to the surface of the object to be irradiated" as used herein may refer to an opening formed such that light irradiated on a side adjacent to the transparent structure of the mask or irradiated on a side opposite to the side adjacent to the transparent structure of the mask may be emitted from the other side of the mask through the opening, and then may be incident on the surface of the object to be irradiated.

The light which has passed through the opening and is incident on the surface of the object to be irradiated may be collimated light or nearly collimated light. The term "collimated light or nearly collimated light" as used herein may refer to light, by which a phenomenon, in which light is diffused or a direction of light is changed when the light from the mask is incident on the surface of the object to be irradiated to such an extent that places which should not be irradiated with the light are irradiated with the light, may be prevented or minimized. For example, the "collimated light or nearly collimated light" as used herein may refer to light, of which a divergence angle is within approximately ±10 degrees, ±5 degrees or ±3.5 degrees when the light is emitted from the mask. The term "divergence angle" may refer to an angle formed between a normal line of the surface of the mask and a direction along which light guided by the opening propagates.

The light guided by the opening may be, for example, linearly polarized light. In a case where the object to be irradiated is a photo-alignment layer, the linearly polarized light may be used so as to realize an aligning property by orientationally ordering a photosensitive material of the photo-alignment layer.

Dimensions such as a thickness, a width or an aspect ratio of the opening of the metal layer may be selected according to a distance between the surface of the object to be irradiated, on which the guided light is incident, and the mask. For example, the thickness, the width or the aspect ratio of the opening may be selected to satisfy a certain functional relationship with the distance between the mask and the surface of the object to be irradiated.

FIGS. 2 and 3 show schematics of illustrative embodiments showing a metal layer 40 having an opening 42. In FIG. 2, the metal layer 40 has a plurality of openings 42 extending in the same direction and parallel to each other. Although not shown in the drawings, the metal layer of the mask may have only one opening, and may be designed in various ways without limitation to the arrangements of openings shown in FIGS. 2 and 3. The number and arrangement of the openings 42 in the metal layer 40 may be, but are not particularly limited, suitably controlled according to a kind of the object to be irradiated. For example, when the object to be irradiated 50 is a photoresist, the number and arrangement of the openings 42 in the metal layer 40 may be selected according to the number or shape of a part to be exposed, or when the object to be irradiated 50 is a photo-alignment layer, the number and arrangement of the openings in the metal layer 40 may be selected in consideration of the number or shape of a part to have the aligning property.

Dimensions such as a thickness (t), a width (w) or an aspect ratio (w/t) of the opening 42 may be controlled according to a distance between a surface of the object 50 to be irradiated and the mask. Here, the distance between the mask and the surface of the object to be irradiated may refer to, for example, a distance between a surface of the metal layer and the surface of the object to be irradiated. That is, even when the transparent supporting structure of the mask faces the object to be irradiated, the distance may be defined as a distance between the surface of the metal layer and the surface of the object to be irradiated. The thickness (t) of the opening 42 may refer to a length of the shortest course along which light irradiated from one surface of the mask passes through the opening 42 of the metal layer 40, for example, may refer to a length of a straight line connecting one surface of the metal layer 40 and the opposite surface thereof perpendicularly. The width (w) of the opening 42 may refer to a length of a straight line connecting both sides of the opening 42 perpendicularly. A dimension of the opening controlled according to the distance from the surface of the object to be irradiated may be, for example, the thickness (t) of the opening 42. The dimension of the opening 42 may be controlled so as to improve straightness of light.

FIG. 3 shows a schematic of one illustrative embodiment of a surface of the metal layer 40 cut in an I-I direction of FIG. 2, which is provided to illustrate that the size of the opening 42 in the metal layer 40 is controlled according to the distance from a surface of the object 50 to be irradiated.

In FIG. 3, the sign "L2" refers to light, the divergence angle of which is zero degree, among lights guided by the opening 42, the sign "L1" refers to light, a divergence angle of which is θ degrees, among light guided by the opening 42. As in FIG. 3, the divergence angle (θ) may refer to an angle formed between the normal line perpendicular to the plane of the metal layer 40 and the direction along with light guided by the opening 42 progresses.

The opening 42 in the metal layer 40 may be configured such that the collimated light or the nearly collimated light may be generated, and therefore only a region of the object 50 that should be irradiated with light, for example, only the region represented as the sign "S" in FIG. 3 may be irradiated with light. For example, even in a case where there is light of a high divergence angle, the dimension of the opening 42 may be controlled considering the distance (e.g., the sign "a" in FIG. 3) between the surface of the object 50 and the mask such that light may not be incident on a region other than the region S, for example, may not be incident on a region defined by the distance (hereinafter, referred to as "leaving distance") represented as the sign "b" in the drawing, or such that the leaving distance may be minimized or may not be present.

For example, the dimension of the opening, referring to FIG. 2, may be selected such that the distance (a) between the object 50 and the mask, and the thickness (t) and the width (w) of the opening 42 may satisfy the Equation 1 below.

$$b = (a/t) \times w \quad \text{[Equation 1]}$$

In FIG. 3, a range of the leaving distance may be controlled according to a situation when the mask is used. For example, when a pattern of the mask has a large width, a long leaving distance may be required, and when it is required that the mask have a uniform pattern, a minimized leaving distance may be needed.

The leaving distance may be ⅕ or less times smaller than the width (w) of the opening 42, and thus the dimension of the opening may be designed such that the thickness (t) of the opening and the distance (a) between the mask and the surface of the object 50 may satisfy Equation 2.

$$5a \leq t \quad \text{[Equation 2]}$$

Referring to FIG. 3, the thickness (t) of the opening 42 may be controlled to be approximately 5 times, 6 times, 7 times, 8 times, 9 times, 10 times or more times the distance (a) between the surface of the object 50 and the mask. The upper limit of the thickness of the opening 42 may be controlled according to a desired degree of the leaving region, but is not particularly limited. As the thickness is increased, the straightness of light may be improved, that is, the divergence angle may be reduced, but illumination of light being incident on the object 50 may be decreased. Therefore, the thickness (t) may be controlled to be 30 times, 20 times or 15 times or less times the distance (a).

The opening in the metal layer may have various shapes as long as it is formed to be capable of guiding the irradiated light. For example, the opening 42, as shown in FIG. 3, may have inner walls formed in parallel to face each other. In this case, the opening 42 may have a square or rectangular-shaped cross-section depending on the thickness of the metal layer 40. If necessary, the opening may be formed such that a side, on which the irradiated light is incident, for example a side facing the transparent supporting structure may be broader than a side, from which the light is emitted, for example, a side opposite to the side facing the transparent supporting structure, and therefore areas become narrower from the side on which the light is incident toward the side from which the light is emitted. In the above, the areas may become regularly or irregularly narrower and narrower. If necessary, the opening may be formed such that its width may be regularly or irregularly decreased and then increased, or increased and then decreased according to (a) thickness direction.

The metal layer may be a metal depositing layer or metal film layer on the transparent supporting structure. Such a metal layer may be formed by depositing a metal on the supporting structure or attaching a metal film. A material for forming the metal layer is not particularly limited. For example, the metal layer may be a layer including a metal capable of blocking, transmitting or reflecting light. Such a metal may be gold, silver, chromium, aluminum, copper, titanium, nickel, molybdenum or tungsten.

The kind of the object to be irradiated with the light guided by the opening of the mask is not particularly limited. In the category of the object to be irradiated, all kinds of objects which are required to be irradiated with collimated light or nearly collimated light with uniform illumination may be included. For example, the object to be irradiated may be a photoresist to be exposed, or a photo-alignment layer to be photo-aligned.

The mask may be maintained in a curved shape. For example, when the surface on which light guided by the opening is incident, is maintained in a curved shape, it may be required that the mask is also maintained to have a curved surface.

The object in the curved shape may be an object on which light is incident during a so-called roll-to-roll process. The term "roll-to-roll process" as used herein may include any process including continuously moving the object to be irradiated by a roll such as a guide roll, a conveyer roll or a winding roll, and irradiating the object with light. In the roll-to-roll process, the light irradiation toward the object to be irradiated may be performed under a state where the object is wound around the roll. If the object wound around the roll is irradiated with light, the light may be incident on the object under a state where the object is effectively fixed.

FIG. 4 shows a schematic of one illustrative embodiment of a process irradiating an object 50 to be irradiated with light through a mask 40 during the roll-to-roll process. As in FIG. 4, the object 50 to be irradiated may be wound around a roll 60 so as to form a curved surface, and may be irradiated with light. The thickness (t) of the opening 42 of the mask 40 may be controlled according to the distance (a) from the object 50 to be irradiated, and here, a radius of the curvature of the surface may also be considered. When the mask 40 includes a plurality of openings 42, thicknesses of the openings 42 may be controlled to be the same, or controlled to be different from each other. For example, when light is incident on the curved surface as in FIG. 4, a distance (a) between the mask 40 and the object 50 to be irradiated may be different according to locations of the openings 42, and in this case, the thickness of each opening 42 may be controlled differently, but is not limited thereto.

A method of maintaining the mask in the curved shape is not particularly limited. For example, the curved mask may be manufactured by forming a surface of the transparent supporting structure to be a curved surface, and then forming the metal layer on the curved surface so as to have the curved surface according to the curved surface of the transparent supporting structure. FIG. 5 shows a schematic of one illustrative embodiment of the mask including the transparent supporting structure 501, one surface of which is the curved surface, and the metal layer 102 formed to have the curved shape on the curved surface of the structure 501.

A shape of the mask maintained in a curved shape, for example, a radius of curvature of the mask, is not particularly limited, and is selected to suitably irradiate the object to be irradiated with the light. For example, the radius of curvature of the mask may be controlled to correspond with that of the object to be irradiated which is maintained in a curved shape. For example, when the mask is maintained in a curved surface, the curved surface of the transparent supporting structure of the mask may have a radius of curvature of approximately 10 to 500 mm.

In one embodiment, the mask may be manufactured by a method including forming the metal layer, in which at least one opening is formed, on a surface of the transparent supporting structure.

The method of forming the metal layer on the transparent supporting structure is not particularly limited. For example, the metal layer may be formed on the transparent supporting structure by sputtering or physical or chemical deposition, or may be formed by laminating a metal film on the transparent supporting structure. A thickness of the metal layer formed above is not particularly limited, and may be controlled in consideration of a desired thickness of the opening.

After forming the metal layer, the opening may be formed by processing the metal layer. The formation of the opening may be performed by processing the metal layer on the transparent supporting structure, or in the case that the metal film is attached, the formation of the opening may be performed by processing the film before or after the film is attached to the supporting structure. The opening may be formed by using, for example, screen printing, resist printing, photolithography or radiation of laser.

During manufacturing the mask, the surface of the supporting structure, on which the metal layer is formed, may be the curved surface, and the metal layer may be formed to be in the curved shape according to the curved surface, and therefore the mask in the curved shape may be prepared.

The present application also relates to a device including the mask, for example, a light irradiation device. One illustrative device may include the mask, and an apparatus on which the object to be irradiated may be placed.

In the above, the mask may be installed such that a distance between the mask and a surface of the object which will be placed on the apparatus may be approximately 50 mm or less. The distance may be, for example, more than 0 mm, or 0.001 mm or more, 0.01 mm or more, 0.1 mm or more or 1 mm or more. The distance may be 40 mm or less, 30 mm or less, 20 mm or less or 10 mm or less. The distance between the surface of the object and the mask may be designed in various combinations by selecting at least one of the above described upper and lower limits.

As described above, the thickness of the opening in the mask in the device may be approximately 5 times, 6 times, 7 times, 8 times, 9 times or 10 times or more times the distance between the surface of the object and the mask. The thickness of the opening may be approximately 30 times, 25 times or 20 times or less times the distance from the surface of the object.

A kind of the apparatus on which the object to be irradiated is placed is not particularly limited, and thus all kinds of apparatuses designed to stably maintain the object during the light irradiation may be included.

The apparatus on which the object to be irradiated is placed may be an apparatus capable of placing the object in a state where the surface of the object is maintained in a curved shape. Such an apparatus may be a roll used during a so-called roll-to-roll process, but is not limited thereto. When the apparatus on which the object to be irradiated is placed is an apparatus capable of placing the object such that its surface may be maintained in a curved shape, the mask may also be maintained in a curved shape. In this case, the curved surface of the mask may correspond to the curved surface of the apparatus on which the object to be irradiated is placed. For example, when the mask having a shape as shown in FIG. 5 is used in the device including the apparatus 60 on which the object to be irradiated is placed as shown in FIG. 4 and the mask 40 as shown in FIG. 4, a concave surface of the curved mask may correspond to the apparatus 60. That is, in the mask having the shape as shown in FIG. 5, the metal layer 102 may be disposed to face the apparatus 60.

The radius of curvature of the curved mask may be controlled on a level corresponding to that of the object maintained by the apparatus. For example, when the radius of curvature of the surface of the object is approximately from 10 to 500 mm, the radius of curvature of the curved mask may be controlled to be from approximately 10 to 500 mm.

The device may further include a light source capable of irradiating the mask with light. As the light source, any one capable of emitting light toward the mask may be used according to purpose without particular limitation. For example, to perform alignment of a photo-alignment layer or exposure of a photoresist using light guided to the opening of the mask, as the light source capable of emitting ultraviolet (UV) rays, a high-pressure mercury UV lamp, a metal halide lamp or a gallium UV lamp may be used.

The light source may include one or more light-irradiating means. If two or more light-irradiating means are included, the number or arrangement of the means is not particularly limited. If the light source includes two or more light-irradiating means, the means may be arranged in at least two rows, and light-irradiating means located on any one of the at least two rows and light-irradiating means located on another row adjacent to the previous row may be alternated and overlapped with each other.

The overlapping of the light-irradiating means with each other may refer to the case where a line connecting a center of the light-irradiating mean on any one row with a center of that in another row adjacent to the previous row is formed in a direction not parallel to the direction perpendicular to each row (a direction inclined at a predetermined angle), and irradiation areas of the light-irradiating means are partially overlapped in a direction perpendicular to each row.

FIG. 6 shows a schematic of one illustrative embodiment of the arrangement of the light-irradiating means as described above. In FIG. 6, two or more light-irradiating means 10 are arranged in two rows, that is, the A and B rows. Among the light-irradiating means in FIG. 6, if one represented as 101 refers to a first light-irradiating mean, and one represented as 102 refers to a second light-irradiating mean, a line P connecting centers of the first and second light-irradiating means is formed not in parallel to a line C formed perpendicular to the directions of the A and B rows. In addition, an irradiated area formed by the first light-irradiating mean and an irradiated area formed by the second light-irradiating mean are overlapped by the range of Q perpendicular to the directions of the A and B rows.

According to the arrangement as described above, a quantity of light irradiated from the light source may be uniformly maintained. A degree of overlapping any one light-irradiating mean and another light-irradiating mean, for example, a length of Q of FIG. 6 is not particularly limited. For example, the overlapping degree may be approximately ⅓ to ⅔ the diameter of the light-irradiating mean, for example, the sign "L" in FIG. 6.

The device may further include at least one light concentration plate to control the quantity of light radiated from a light source. The light concentration plate may be included in the device to radiate collected light to the mask after the light radiated from the light source is incident to the light concentration plate and collected. As the light concentration plate, any one conventionally used in the related art in which light radiated from the light source may be collected, may be used. The light concentration plate may be a lenticular lens layer.

The device may further include a polarizing plate. For example, the polarizing plate may be used to generate linearly polarized light from the light radiated from the light source. The polarizing plate may be included in the device such that the light radiated from the light source is incident to be radiated to the mask through the polarizing plate. In addition, when the device includes a light concentration plate, the polarizing plate may be present at a location that the light radiated from the light source may be collected to the light concentration plate and then incident to the polarizing plate.

As a polarizing plate, any one capable of generating linearly-polarized light from light radiated from the light source may be used without particular limitation. Such a polarizing plate may be a glass plate or wire grid polarizing plate, which is disposed at a Brewster angle.

FIG. 7 shows a schematic of one illustrative embodiment of the light irradiation device 1. The device 1 of FIG. 7 includes a light source 10, a light concentration plate 20, a polarizing plate 30, a mask 40, and an apparatus 60 on which the object 50 is placed, which are sequentially disposed. In the device 1 of FIG. 7, light emitted from the light source 10 may be incident on the light concentration plate 20, be concentrated thereby, and then be incident again on the polarizing plate 30. The light incident on the polarizing plate 30 may be polarized so as to become linearly-polarized light, be incident again on the mask 40, be guided by the opening, and then be incident on a surface of the object 50 to be irradiated.

The present application also relates to a light irradiating method. One illustrative method may be performed by using the light irradiation device as described above. The method may include placing an object to be irradiated on the apparatus on which the object may be placed, and irradiating the object with light via the mask.

In this operation, the light that is incident on the mask may be guided by the opening of the mask and then be incident on the object to be irradiated. In this operation, as described above, a dimension or shape of the opening of the mask may be controlled according to the distance from or the shape of the object to be irradiated.

In one embodiment, the object to be irradiated may be a photo-alignment layer. In this case, the light irradiating method may be a method of forming an aligned or orientationally ordered photo-alignment layer. For example, the photo-alignment layer may be placed on the apparatus, and then may be irradiated with the linearly-polarized light via the mask, and therefore the photo-alignment layer having the aligning property may be prepared by ordering photosensitive materials in the photo-alignment layer along a predetermined direction.

A kind of the photo-alignment layer which may be applied to the method is not particularly limited. As a compound including a photosensitive residue in the corresponding field, various kinds of photo-alignment compounds which may be used in formation of the photo-alignment layer are known, and all of the known materials may be used to form the photo-alignment layer. As a photo-alignment compound, for example, a compound aligned by trans-cis photoisomerization; a compound ordered by chain scission or photo-destruction such as photo-oxidation; a compound ordered by photo-crosslinking such as [2+2] cycloaddition, [4+4] cycloaddition or photodimerization or photopolymerization; a compound ordered by photo-Fries rearrangement, or a compound ordered by ring opening/closure. As the compound ordered by trans-cis photoisomerization, for example, an azo compound such as a sulfonated diazo dye or an azo polymer or a stilbenes, may be used, and as the compound ordered by photo-destruction, cyclobutane-1,2,3,4-tetracarboxylic dianhydride), aromatic polysilane or polyester, polystyrene or polyimide may be used. In addition, as the compound ordered by photocrosslinking or photopolymerization, a cinnamate compound, a coumarin compound, a cinnamamide compound, a tetrahydrophthalimide compound, a maleimide compound, a benzophenone compound or a diphenylacetylene compound or a compound having a chalconyl residue as a photosensitive residue (hereinafter, a chalcon compound), or a compound having an anthracenyl residue (hereinafter, an anthracenyl compound) may be used, as the compound ordered by photo-Fries rearrangement, an aromatic compound such as a benzoate compound, a benzoamide compound, a methacrylamidoaryl methacrylate compound may be used, and as the compound ordered by ring opening/closure, a compound ordered by ring opening/closure of a [4+2] π-electronic system such as spiropyran compound may be used, but the present application is not limited thereto. For example, the photo-alignment layer may be formed on a suitable supporting base using the compound, and such a photo-alignment layer may be conveyed by an apparatus capable of placing the object to be irradiated, for example, a roll, and thus applied to the method.

In the method, the photo-alignment layer on which light is incident via the mask may be a primarily-aligned photo-alignment layer. The primarily-aligned photo-alignment layer may be prepared by irradiating the entire surface of the photo-alignment layer with linearly-polarized ultraviolet rays in a certain direction before light is incident thereon via the mask. By irradiating the primarily-aligned photo-alignment layer with light, of which a polarized direction is different from that of the light used to prepared the primarily-aligned photo-alignment layer, regions corresponding to the opening of the mask are irradiated with the light, and therefore only photosensitive materials in the regions are re-ordered so as to prepare the photo-alignment layer in which directions of the ordering of the materials are patterned.

To prepare the photo-alignment layer, for example, if the linearly-polarized UV ray is incident on the layer once or more, the aligned direction of the layer may be determined by a direction of the finally irradiated light. Therefore, if the primary alignment is performed by irradiating the entire surface of the photo-alignment layer with the linearly-polarized ultraviolet ray in a predetermined direction and then light having a different polarized direction from the ultraviolet ray of the primary alignment is incident on the layer via the mask, the aligned direction may be changed only in the regions corresponding the opening of the mask to be different from that of the primary alignment. Therefore, the pattern or at least two kinds of aligned regions including at least a first aligned region having a first aligned direction and a second aligned region having a second aligned direction different from the first aligned direction may be formed on the photo-alignment layer.

In one embodiment, a polarized axis of the linearly-polarized ultraviolet ray of the primary alignment may be perpendicular to that of the ultraviolet ray incident on the layer via mask. The term "perpendicular" as used herein may refer to substantially perpendicular. The photo-alignment layer formed by controlling the polarizing axes of lights in the primary and secondary alignments may be used in, for example, an optical filter configured to realize a stereoscopic image.

For example, an optical filter may be manufactured by forming a liquid crystal layer on the photo-alignment layer formed as described above. A method of forming a liquid crystal layer is not particularly limited, and the liquid crystal layer may be formed by coating and aligning liquid crystal compounds that can be cross-linked or polymerized by light on the photo-alignment layer, and irradiating the layer of the liquid crystal compounds with light so as to crosslink or polymerize. Throughout the above operations, the layer of the liquid crystal compound may be aligned and fixed according to the aligned directions of the photo-alignment layer, thereby manufacturing the liquid crystal film including at least two regions having different aligned directions.

A kind of the liquid crystal compound coated on the photo-alignment layer is not particularly limited, and may be suitably selected according to the use of the optical filter. For example, when the optical filter is a filter for realizing a three-dimensional image, the liquid crystal compound may be a liquid crystal compound capable of being aligned according to an alignment pattern of the underlying alignment layer and forming a liquid crystal polymer layer exhibiting a $\lambda/4$ retardation characteristic due to photocrosslinking or photopolymerization. The term "$\lambda/4$ retardation characteristic" may refer to a characteristic capable of delaying a phase ¼ times the wavelength of incident light. When such a liquid crystal compound is used, the optical filter capable of dividing the incident light into left-circularly polarized light and right-circularly polarized light may be manufactured.

A method of coating the liquid crystal compound, and aligning, that is, ordering the compound according to an alignment pattern of the underlying alignment layer or crosslinking or polymerizing the aligned compound is not particularly limited. For example, the alignment may be performed in such a manner that the liquid crystal layer is maintained at a suitable temperature in which the compound may exhibit liquid crystallinity according to the kind of the liquid crystal compound. In addition, the crosslinking or polymerization may be performed by radiating light with an intensity that may induce suitable crosslinking or polymerization to the liquid crystal layer according to the kind of the liquid crystal compound.

Advantageous Effects

By the mask, collimated light or nearly collimated light may be irradiated with uniform illumination on the object to be irradiated. Further, by the mask, light may be effectively irradiated even in a state where the object to be irradiated has the curved surface.

Figure 1:
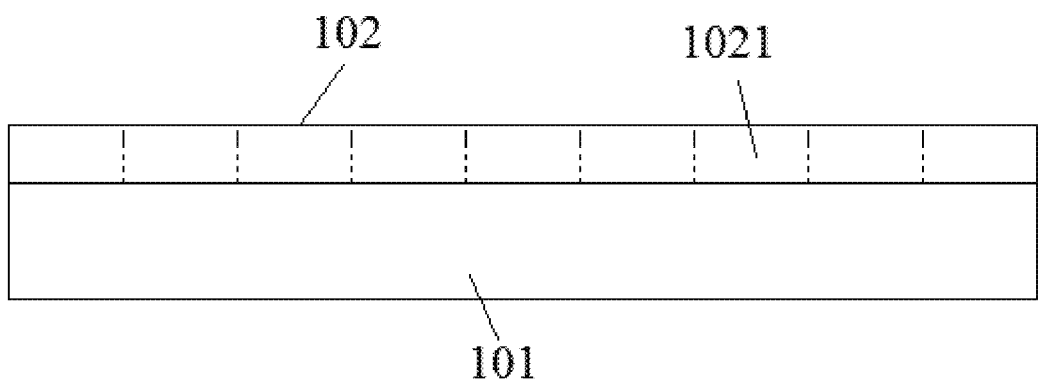
FIG. 1 shows a schematic of one illustrative embodiment of the mask.

REFERENCE SIGNS LIST 101, 501: the transparent supporting structure
40, 102: the metal layer
42, 1021: the opening
50: the object to be irradiated
t: the thickness of opening
w: the width of opening
L1, L2: the light
a: the distance between mask and object to be irradiated
b: the leaving distance
S: the radiating location
60: the apparatus on which object to be irradiated is placed
10, 101, 102: the light-irradiating means
1: the device including the mask Modes of the Invention Hereinafter, the above will be described in further detail with reference to Examples, but the scope of the mask and the like is not limited to the following Examples.

EXAMPLE 1

Manufacture of Mask

Figure 2:
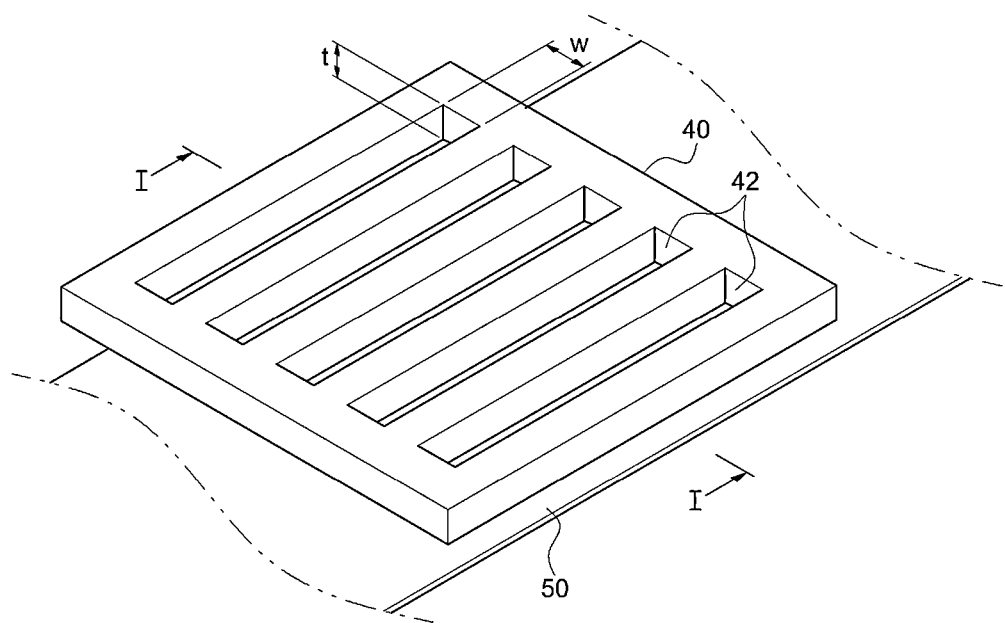
FIGS. 2 and 3 show schematics of illustrative embodiments of the relationship between the dimension of the opening and the distance between the mask and the object to be irradiated.
Figure 3:
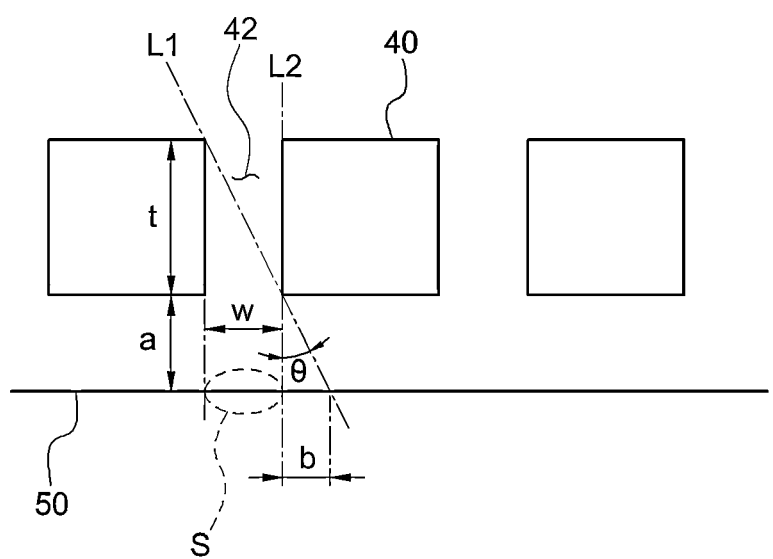
Figure 4:
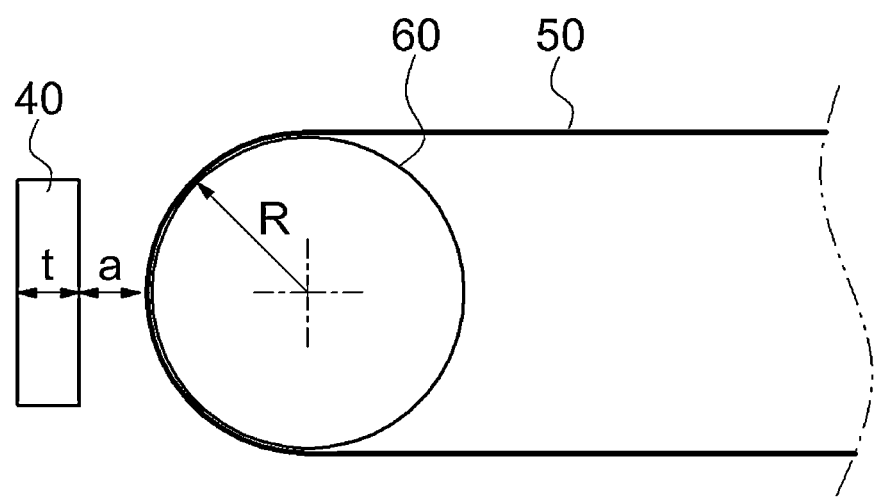
FIG. 4 shows a schematic of one illustrative embodiment of the light irradiation device.

A curved surface, of which the radius of curvature was approximately 200 mm, was formed by processing one surface of a quartz plate which was a transparent supporting structure. Subsequently, the metal layer having a thickness of approximately 200 nm was formed by depositing chromium on the formed curved surface by sputtering. Afterward, the metal layer was processed by laser etching to form an opening having a width (w) of approximately 540 μm, a thickness (t) of approximately 100 mm and a gap between openings of approximately 540 μm in the shape as shown in FIG. 2, and thus a mask was manufactured in the shape as shown in FIG. 5.

Manufacture of Optical Filter

Figure 5:
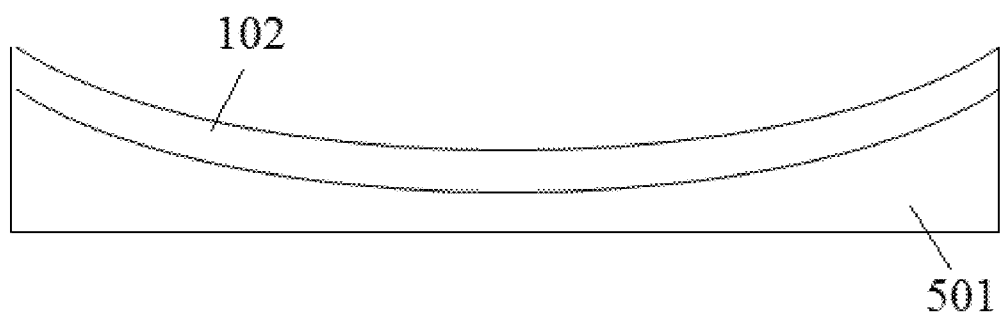
FIG. 5 shows a schematic of one illustrative embodiment of the mask in the curved shape.
Figure 6:
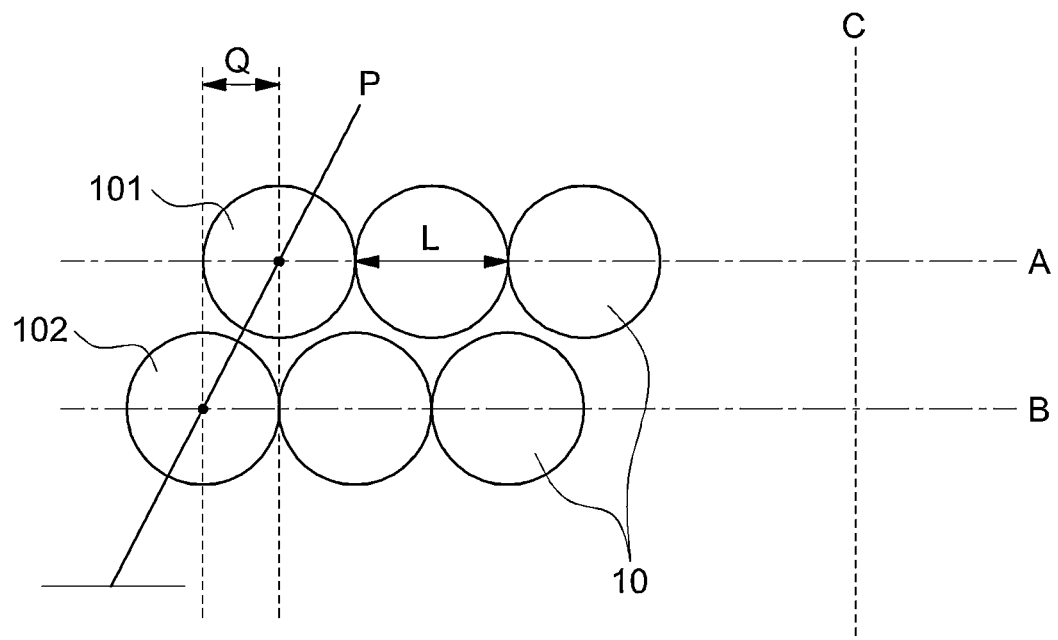
FIG. 6 shows a schematic of one illustrative embodiment of the arrangement of the light-irradiating means.
Figure 7:
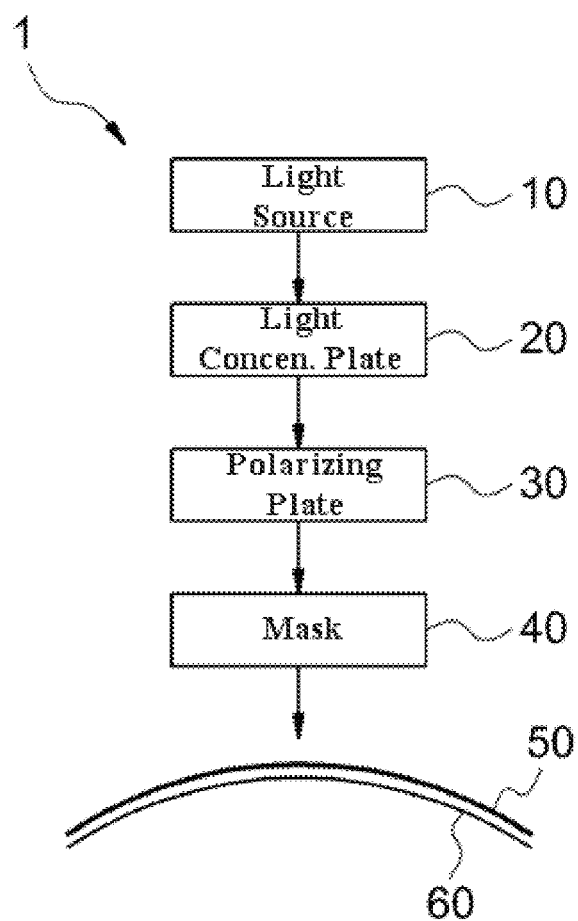
FIG. 7 shows a schematic of one illustrative embodiment of the light irradiation device.

Devices in FIGS. 5 and 7 were configured using the mask manufactured as described above. Specifically, an UV lamp was used as the light source, a conventional collimator lens was used as the light concentration plate and a wire grid polarizer was used as the polarizing plate. The device was designed such that light emitted from the light source may be concentrated by the light concentration plate and then may be incident on the mask after passing through the polarizing plate. As the apparatus on which the object to be irradiated may be placed, a roll having a curved surface was used, and a mask was installed such that a concave surface of the mask corresponded to the roll. In the above, a distance between the mask and the roll on which the object to be irradiated was placed was to be approximately 200 μm. A radius of curvature of the roll and the radius of curvature of the mask are approximately matched to secure approximately the same distances on a surface of the roll and the entire surface of the mask. Then, the photo-alignment layer and the optical filter were manufactured by the following method. A layer of a coating solution for forming the photo-alignment layer including a polycinnamate was formed to have a dry thickness of 1,000 Å on an 80-μm thick triacetyl cellulose (TAC) base. The layer was formed by coating the coating solution on the TAC base by roll coating, drying the coated result at 80° C. for 2 minutes, and removing a solvent therefrom. Here, the coating solution was prepared by mixing a mixture of polynorbonene (weight average molecular weight (Mw)=150,000) having a cinnamate group of Formula 1 and an acrylic monomer with a photoinitiator (Igacure 907), and dissolving the mixed result in a cyclohexanone solvent to have a solid content of polynorbornene of 2 weight % (polynorbonene: acrylic monomer: photoinitiator=2:1:0.25 (weight ratio)). Primary alignment was performed by irradiating the entire surface of the layer with linearly-polarized ultraviolet ray (300 mW/cm$^2$) without the mask. Then, secondary alignment was performed by irradiating the photo-alignment layer through the mask with linearly-polarized ultraviolet ray (300 mW/cm$^2$) having a polarizing axis perpendicular to that of the linearly-polarized UV ray in the primary alignment to. After the secondary alignment, a retardation layer having a λ/4 wavelength characteristic was formed on the alignment layer. Particularly, an optical filter including a region in a different direction from a slow axis according to alignment of the underlying photo-alignment layer, was manufactured by coating a liquid crystal compound (LC242™, BASF) on the photo-alignment layer to have a dry thickness of approximately 1 μm, aligning the compound according to alignment of the underlying photo-alignment layer, and radiating a UV ray (300 mW/cm$^2$) for approximately 10 seconds to crosslink and polymerize.

Figure 8:
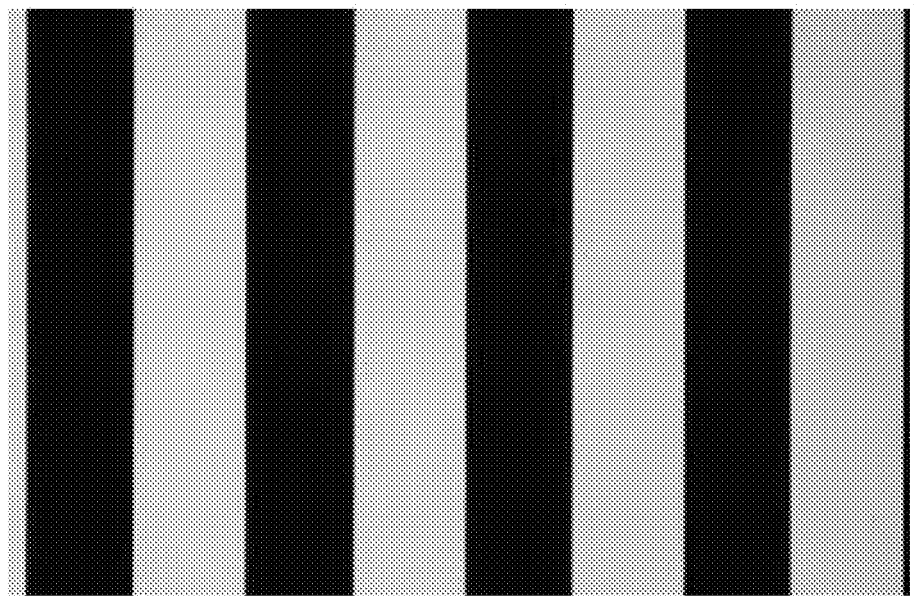
FIGS. 8 to 10 show states of the photo-alignment layer in Examples and Comparative Example.

An enlarged image showing a state of the aligned photo-alignment layer by the method is shown in FIG. 8. Referring to FIG. 8, it can be confirmed that the photo-alignment layer having an effective alignment pattern was formed by the method.

[Formula 1]

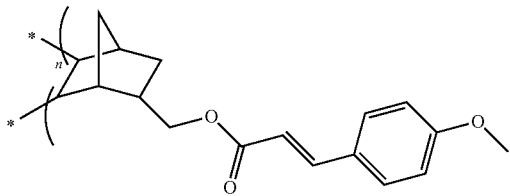

EXAMPLE 2

Manufacture of Mask

A metal (copper) film having a thickness of approximately 50 um was manufactured by processing the film by laser etching to have the shape shown in FIG. 2, and form an opening having a width (w) of approximately 540 μm, a thickness of approximately 100 mm and a gap between the openings of approximately 540 μm. Subsequently, the metal film manufactured as described above was attached to a curved surface of a quartz plate processed to form a curved surface having a radius of curvature of approximately 200 mm on one surface, thereby manufacturing the same shown in FIG. 5.

Manufacture of Optical Filter

Figure 9:
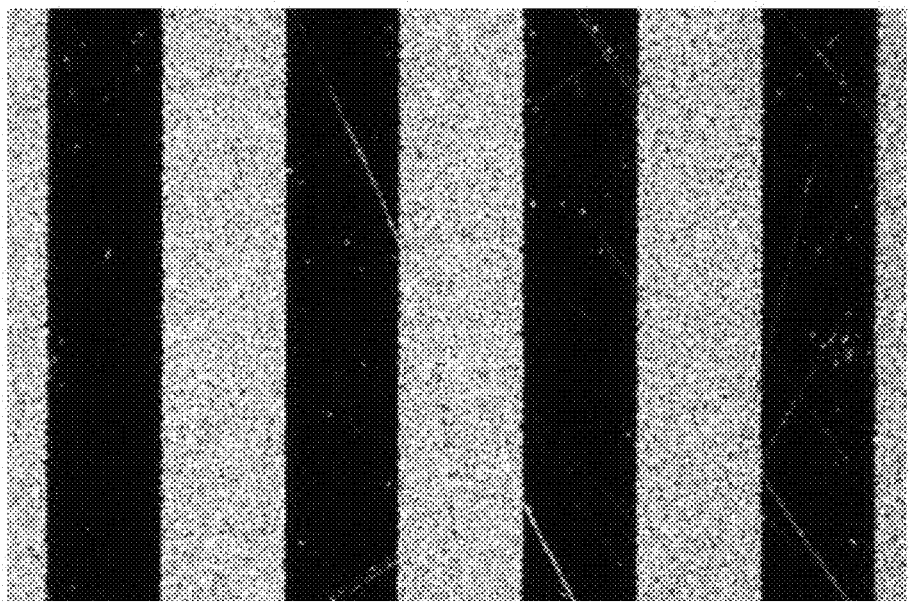

An optical filter was manufactured by the same method as described in Example 1, except that the mask manufactured above was used. An enlarged image of the photo-alignment layer aligned by the above method is shown in FIG. 9.

EXAMPLE 3

Figure 10:
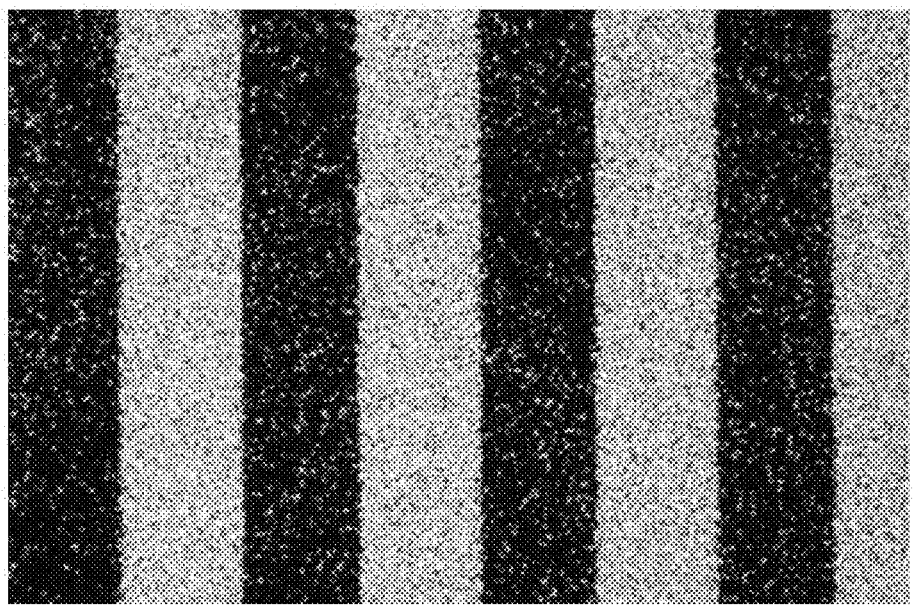

An optical filter was manufactured by the same method as described in Example 1, except that a gap between a mask and a photo-alignment layer was controlled to approximately 500 μm in secondary alignment. An enlarged image of the photo-alignment layer aligned by the above method is shown in FIG. 10.

The invention claimed is:

1. A device, comprising:
an apparatus configured to position an object to be irradiated opposite a mask, the mask comprising:
a transparent supporting structure having a surface with a curved shape; and
a metal layer having at least one opening to guide light to the object, and having a surface with the curved shape of the transparent supporting structure, and
wherein a width of the at least one opening is 5 or more times a distance between the mask and the apparatus.

2. The device according to claim 1, wherein the transparent supporting structure is a transparent ceramic structure.

3. The device according to claim 1, wherein the metal layer is a metal deposition layer or a metal film layer.

4. The device according to claim 1, wherein the metal layer comprises gold, silver, chromium, aluminum, copper, titanium, nickel, molybdenum or tungsten.

5. The device according to claim 4, wherein the metal layer has a radius of curvature in the range from 10 mm to 500 mm.

6. The device according to claim 1, wherein the distance between the mask and the apparatus is 50 mm or less.

7. The device according to claim 1, wherein the apparatus is configured to maintain a surface of the object opposite the mask as a curved surface.

8. The device according to claim 7, wherein the the curved surface has a radius of curvature from 10 mm to 500 mm.

9. The device according to claim 1, further comprising a light source configured to irradiate linearly-polarized light toward the mask.

10. A method, comprising placing an object to be irradiated on the apparatus of the device of claim 1, and irradiating the object with light via the mask of the device of claim 1.

11. The method according to claim 10, wherein a surface of the object, that is irradiated with light via the mask is maintained as a curved surface during the irradiating.

12. The method according to claim 11, wherein the curved surface of the object, is irradiated with light via the mask that is formed in a curved shape.

13. The method according to claim 10, wherein the object to be irradiated is moved by a guide roll, a conveyor roll, or a winding roll.

14. A method of manufacturing an orientationally ordered photo-alignment layer, comprising: placing a photo-alignment layer on the apparatus of the device of claim 1, and irradiating the photo-alignment layer with linearly-polarized light via the mask of the device of claim 1.

15. The device according to claim 1, wherein the metal layer is disposed on the transparent supporting structure.

16. The device according to claim 1, wherein the apparatus comprises a roll configured to continuously move the object to be irradiated, wherein the roll is a guide roll, a conveyor roll, or a winding roll.

17. A method of manufacturing a device, the method comprising:
   providing an apparatus; and
   forming a mask by forming a metal layer having at least one opening having a thickness to guide light to an object to be irradiated, the metal layer formed on a curved surface of a transparent supporting structure;
   wherein the width of the at least one opening is 5 or more times a distance between the mask and the apparatus.

18. The method according to claim 17, wherein the surface of the transparent supporting structure on which the metal layer is formed is curved, and wherein the metal layer is formed in a curved shape according to the curved surface of the transparent supporting structure.

19. The method according to claim 17, wherein the metal layer is formed by depositing a metal on the surface of the transparent supporting structure, or laminating a metal film on the surface of the transparent supporting structure.

20. The method according to claim 17, wherein the at least one opening is formed by screen printing, resist printing, photolithography or laser processes.

\* \* \* \* \*